(12) United States Patent
Hertwig

(10) Patent No.: US 8,598,992 B2  
(45) Date of Patent: Dec. 3, 2013

(54) SELF-CALIBRATING RFID TRANSPONDER

(75) Inventor: Bernd Hertwig, Berlin (DE)

(73) Assignee: Texas Instruments Deutschland GmbH, Freising (DE)

( * ) Notice: Subject to any disclaimer, the term of this patent is extended or adjusted under 35 U.S.C. 154(b) by 782 days.

(21) Appl. No.: 12/261,573

(22) Filed: Oct. 30, 2008

(65) Prior Publication Data

US 2009/0174529 A1    Jul. 9, 2009

(30) Foreign Application Priority Data

Oct. 30, 2007  (DE) ................. 10 2007 051 792

(51) Int. Cl.
| | |
|---|---|
| G05B 11/01 | (2006.01) |
| H04Q 5/22 | (2006.01) |
| G08B 13/14 | (2006.01) |
| H03J 3/20 | (2006.01) |
| H04B 1/00 | (2006.01) |
| H04B 1/18 | (2006.01) |
| H04B 1/26 | (2006.01) |

(52) U.S. Cl.
USPC ............... 340/12.51; 340/10.5; 340/10.51; 340/572.4; 455/42; 455/150.1; 455/173.1; 455/184.1; 455/197.3; 334/71; 334/78

(58) Field of Classification Search
USPC .................. 455/41, 260; 340/572.1
See application file for complete search history.

(56) References Cited

U.S. PATENT DOCUMENTS

| | | | | |
|---|---|---|---|---|
| 5,204,882 A | * | 4/1993 | Chao et al. | 375/354 |
| 5,550,547 A | * | 8/1996 | Chan et al. | 342/42 |
| 6,272,321 B1 | * | 8/2001 | Bruhnke et al. | 455/41.1 |
| 6,529,156 B2 | * | 3/2003 | Morchel et al. | 342/172 |
| 2002/0119751 A1 | * | 8/2002 | Baumann et al. | 455/41 |
| 2005/0186930 A1 | * | 8/2005 | Rofougaran et al. | 455/260 |
| 2007/0018832 A1 | * | 1/2007 | Beigel et al. | 340/572.7 |

FOREIGN PATENT DOCUMENTS

| | | |
|---|---|---|
| DE | 4332798 A1 | 3/1995 |
| DE | 10029673 A1 | 10/2002 |
| DE | 10151856 A1 | 5/2003 |
| EP | 0625832 A1 | 11/1994 |

* cited by examiner

*Primary Examiner* — Steven Lim  
*Assistant Examiner* — Pameshanand Mahase  
(74) *Attorney, Agent, or Firm* — William B. Kempler; W. James Brady, III; Frederick J. Telecky, Jr.

(57) ABSTRACT

A RFID transponder includes a resonant circuit for providing a clock signal at a predetermined clock frequency, a self-calibration stage for calibrating the resonant circuit's current clock frequency towards the predetermined clock frequency. The self-calibration stage is adapted to compare a first clock frequency of the resonant circuit determined during an interrogation period, during which the resonant circuit is excited by an external RF signal, with a second clock frequency determined during a frequency maintenance period, during which the resonant circuit is excited internally through an oscillation maintenance circuit of the RFID transponder and to calibrate the resonant circuit towards the predetermined clock frequency based on the comparison result.

14 Claims, 3 Drawing Sheets

SELF-CALIBRATING RFID TRANSPONDER

FIELD OF THE INVENTION

The present invention relates to a RFID transponder, and more specifically the present invention relates to a method and circuitry for calibrating a RFID transponder. The present invention relates also to a system with a RFID transponder.

BACKGROUND OF THE INVENTION

RFID transponders are used for all kinds of identification tasks. They can contain data which is written to or read out by read/write units (R/W-units) in a downlink or uplink data transmission, respectively. The antenna of a RFID transponder is typically built with an inductive loop. This inductor is coupled to a capacitor to form a resonant circuit. During downlink data transmission, the resonant circuit is excited by a radio frequency signal (e.g. 134 kHz). Being subject to the external RF excitation, the resonant circuit starts oscillating. In an uplink data transmission phase, the RFID must perform an oscillation with the resonant circuit, which is then received by the R/W unit. An important characteristic is the maximum reading distance over which data can be safely read. In order to reach large reading distances, the resonant circuit should oscillate exactly at a predetermined frequency. Therefore, resonant circuits of RFID transponders are calibrated in a final stage of the manufacturing line. They are typically based on integrated circuits. The resonant frequency is measured by an external test equipment and based on the test result some trimming capacitors are activated in an integrated circuit (IC) of the RFID transponder. Thereafter, further calibration of the RFID transponder can only be performed with external components. Actually, a second calibration step is practically never performed. The calibration procedure is an important economical aspect of the RFID transponder manufacturing process. It is therefore generally desirable to simplify the calibration process and thereby rendering calibration more flexible.

SUMMARY OF THE INVENTION

An aspect of the present invention provides a RFID transponder with a resonant circuit for providing a clock signal at a predetermined clock frequency. Further, there is a self-calibration stage for calibrating the resonant circuit's current clock frequency towards the predetermined clock frequency. The self-calibration stage is adapted to compare a first clock frequency of the resonant circuit determined during an interrogation period, during which the resonant circuit is excited by an external RF signal, with a second clock frequency determined during an frequency maintenance period, during which the resonant circuit is excited internally through an oscillation maintenance circuit of the RFID transponder and to calibrate the resonant circuit towards the predetermined clock frequency based on the comparison result. Instead of using external test devices the calibration procedure is performed by the RFID transponder itself. The self-calibration procedure is then based on two phases, an interrogation phase and a frequency maintenance period. RFID transponders generally have frequency maintenance circuits, which they use for uplink data transmission, when no extern RF signal is present. The frequency maintenance circuit then excites the RFID transponder's resonant circuit to oscillate at the resonant frequency. The second clock frequency is then derived from the oscillation of the resonant circuit. Also, the first clock frequency is derived from the resonant circuit's oscillation during the interrogation period. The only provision that has to be made externally is the presence of an interrogation period. However, any external excitation with a well defined frequency can be used. When externally excited, the resonant circuit will oscillate at the RF frequency of the external RF signal regardless of the actual exact resonant frequency of the resonant circuit. However, during the frequency maintenance period, the resonant circuit will oscillate at the frequency which is given by the electrical properties of the RFID transponder's front end, i.e. basically by the inductively of the inductive antenna, the capacitance of the capacitor (or capacitors) and the respective parasitic components. Therefore, the first clock frequency corresponds to the frequency of the external RF signal, and the second clock frequency corresponds to resonant circuits true resonant frequency. The two determined clock frequencies (i.e. the clock frequency of the resonant circuit excited with the external RF signal and the frequency achieved with the resonant circuit during oscillation maintenance (i.e. self-excitation)) can then be compared and the calibration procedure can take place without any further intervention from an external device. For example, the resonant frequency can be adapted by adding or removing capacitance from the integrated capacitor (or capacitors) of the resonant circuit. There are many ways of implementing the clock frequency comparison.

Advantageously, the self-calibration stage includes further an auxiliary oscillator for providing an auxiliary clock signal, a first counter for counting clock periods (i.e. e.g. the rising and/or falling edges) of the first and second clock signals and a second counter for counting clock periods (i.e. e.g. the rising and/or falling edges) of an auxiliary clock signal. Since both, the first and the second clock signal are generated by the same resonant circuit, they constitute only a single internal clock signal having the first or second frequency dependent on the phase (i.e. the interrogation phase or the oscillation maintenance period). There are basically two ways of performing the comparison of the different clock frequencies. Either the auxiliary clock periods are counted over a fixed number of periods of the clock signal, or the clock periods of the clock signal are counted over a fixed number of periods of the auxiliary clock signal. The auxiliary clock signal must be generated independently from the resonant circuit. A ring oscillator can be an advantageous implementation of an oscillator to be used for generating the auxiliary clock signals. Using a rather simple and imprecise ring oscillator is possible, since only short time stability is necessary for the comparison. However, the auxiliary oscillator should be supply voltage independent. This is particularly advantageous for passive RFID transponders, where the internal supply voltage is generated by rectifying the received RF signal and charging a large buffer capacitor. The measurement of the first clock frequency and the second clock frequency should be performed with only little delay. The oscillation maintenance period should preferably directly follow the interrogation period. In an advantageous implementation the auxiliary clock frequency can be higher than the clock frequency, e.g. by a factor between 5 to 10. The clock periods of the auxiliary clock can then be counted over a fixed number of clock periods of the clock frequency derived from the resonant circuit during interrogation and during maintenance phase. The factor between the clock frequency and the auxiliary clock frequency defines the resolution for the calibration procedure.

According to an aspect of the invention, the second counter can be an UP/DOWN counter, which counts in an UP mode during the interrogation phase and in a DOWN mode during the oscillation maintenance period. The remaining count after the oscillation maintenance period represents then the deviation of the frequency of the resonant circuit and the calibration procedure can be based on the count. The count can be a positive or negative number.

The self-calibrating stage can include an adder stage. The adder stage can be used to add a previous calibration value to a current calibration value. A second way to add the new calibration value to the previously calibration value is to start the second counter (i.e. e.g. the UP/DOWN counter) not from zero, but load the previously calibration value into the second counter at the beginning of the interrogation phase. In this case no adder stage is necessary. If the self-calibration is performed during a final stage of the manufacturing process and then repeated later, it can be very advantageous to do calibration based on the previous value. This can speed up the calibration and be used for finer calibration in a second self-calibration step.

According to an aspect of the invention, the self-calibration stage can include a trimming means which is coupled to the resonant circuit. The trimming means can then be adjusted in response to an output of the adder stage or the counter for calibrating the clock frequency towards the target clock frequency. The trimming means advantageously includes an array of capacitors and switches for selectively switching the capacitors to or from the capacitor of the resonant circuit so as to adjust the resonant circuit's resonant frequency for calibrating the clock frequency.

An aspect of the present invention also provides a method for self-calibrating a RFID transponder. According to the method a first clock frequency is determined, which is derived from an oscillation of a resonant circuit of the RFID transponder during an interrogation period. During the interrogation period, the resonant circuit is externally excited by a RF signal. A second clock frequency is determined that is also derived from an oscillation of the resonant circuit. The second clock frequency is determined during a clock maintenance period during which the resonant circuit is internally excited by an oscillation maintenance circuit. The difference between the first clock frequency and the second clock frequency is then determined and the resonant circuit is calibrated in accordance with the determined difference.

An aspect of the present invention also provides a RFID transponder manufacturing method. According to this method the RFID transponder self-calibration is performed in a final stage of the manufacturing process. The RFID transponder receives an RF signal in an interrogation phase and performs the self-calibration steps as described hereinabove.

An aspect of the present invention further provides a identification system including a RFID transponder according to the aspects of the invention set out hereinabove. The system can includes a R/W-unit adapted to prompt the RFID transponder to perform the self-calibration procedure in accordance with the previously described aspects of the invention.

A RFID system and a transponder according to the invention, as well as the method described hereinabove can advantageously be used in a final manufacturing stage, but also in any kind of application for calibrating or re-calibrating the RFID transponder.

BRIEF DESCRIPTION OF THE DRAWINGS

Further aspects of the invention will ensue from the description hereinbelow of a preferred embodiment of the invention with reference to the accompanying drawings, wherein.

DETAILED DESCRIPTION OF THE INVENTION

Figures 1, 5:
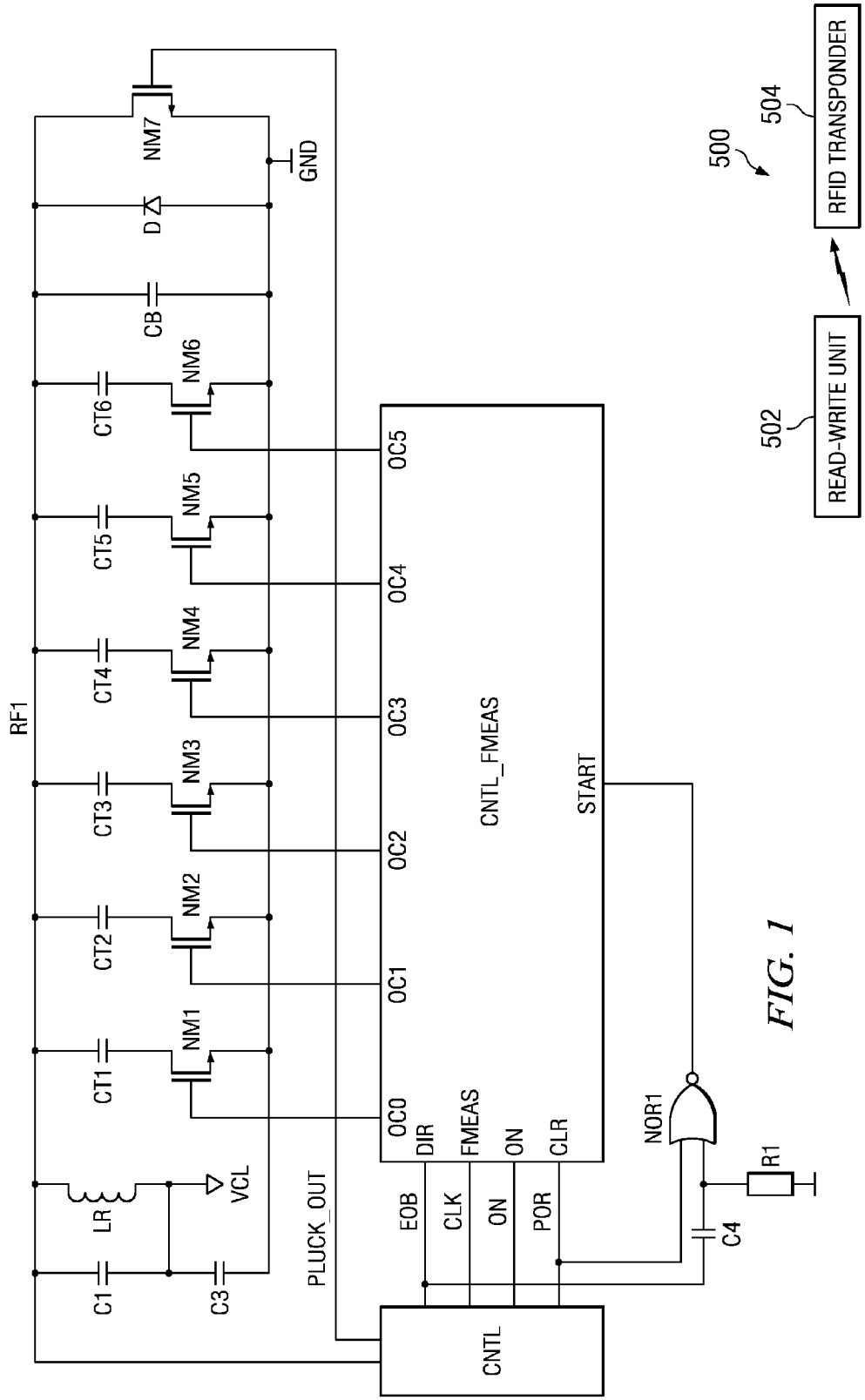
FIG. 1 is a simplified block diagram of a preferred embodiment of the present invention.
FIG. 5 is a block diagram of a identification system according to the present invention.

FIG. 1 shows a simplified circuit diagram of an embodiment of the present invention. The resonant circuit comprises the resonant capacitor CR and the inductive antenna LR. The resonant circuit is coupled through capacitor C3 to ground. C3 works as buffer capacitor for VCL. There is further a diode D operating as a simple rectifier and an internal capacitor CB (CB represents a parasitic capacitor). The internal supply voltage VCL is generated if an external radio frequency signal is received through antenna LR. The received RF signal is present at node RF1. The node RF1 is coupled to the control stage CNTL. The control CNTL derives the output signals CLK, EOB, ON and POR from the signal at node RF1, i.e. the RF signal. If now external RF signal is present, the resonant circuit CR, LR is excited through transistor NM7 which is controlled by the control signal PLUCK_OUT. The control stage CNTL is a conventional control stage producing the end of burst signal EOB, the clock signal CLK, a signal ON, and a power on reset signal POR. During an oscillation maintenance period the transistor NM7 is periodically switched on, thereby maintaining an oscillation of the resonant circuit CR, LR. The control stage CNTL_FMEAS includes the circuit necessary to implement important aspects of the present invention. Based on the end of burst signal EOB, the clock signal CLK, the signal ON and the power on reset signal POR, as well as a start signal which is based on the end of burst signal EOB and the POR signal through a logical NOR gate NOR1, the control stage CNTL_FMEAS produces output signals OC0 to OC5. These output control signals are adapted to selectively switch transistors NM1 to NM6 in order to add or remove one of the trimming capacitors CT1 to CT6 to the resonant circuit CR, LR. The control stage CNTL_FMEAS is shown in further detail in FIG. 2.

Figure 2:
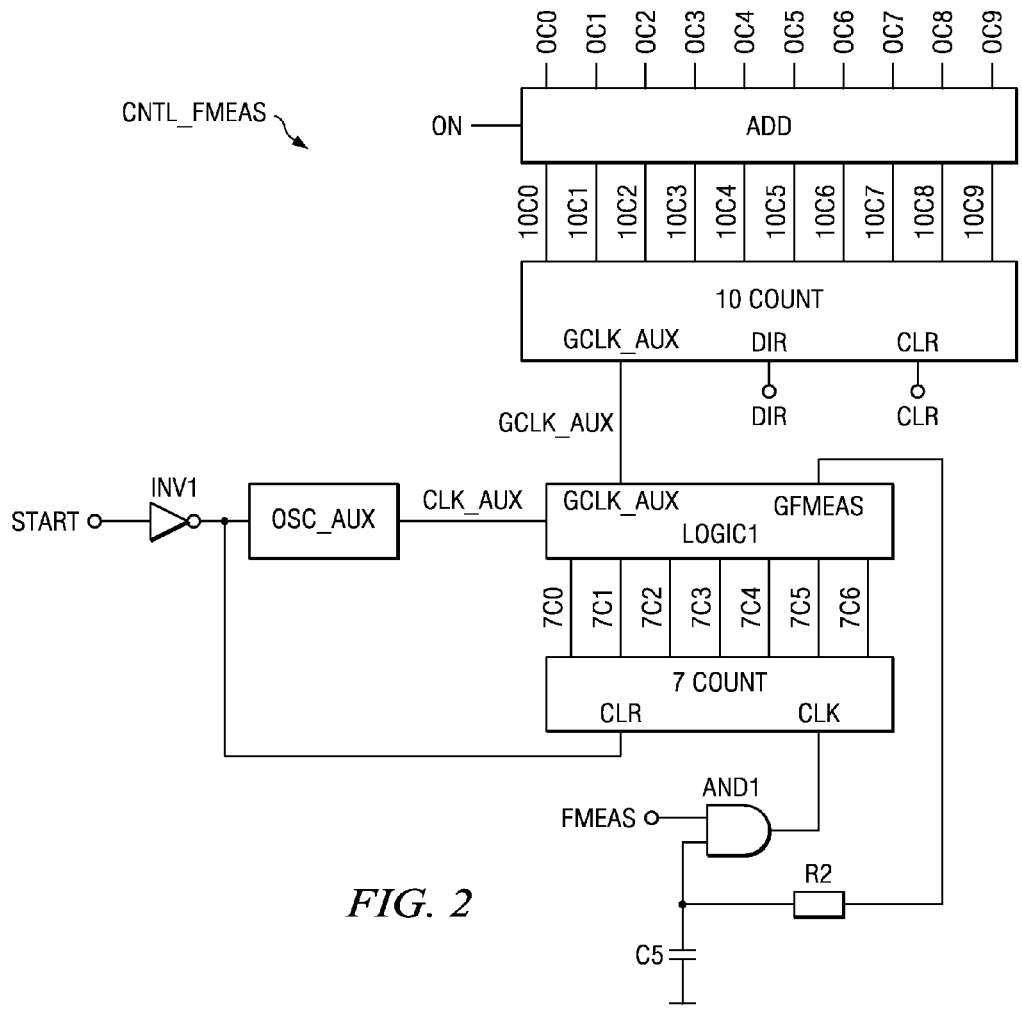
FIG. 2 is a simplified block diagram of a control stage according to aspects to the present invention.

FIG. 2 shows a simplified circuit diagram of the control stage CNTL_FMEAS according to aspects of the present invention. The input signal FMEAS is the clock signal, which is based on the frequency of the oscillation of the resonant circuit CR, LR. In this embodiment of the invention, a fixed number of periods of the clock signal FMEAS is used to clock the counter 7COUNT. The logic stage LOGIC1 produces an output signal GFMEAS, which is a signal used to gate the clock input FMEAS, such that only a fixed number of clock periods can be input to the clock input CLK of the counter 7COUNT. If the input signal START goes low, the UP-counter is cleared. The output signals 7C0 to 7C6 of the counter 7COUNT are gated in a logic stage LOGIC1 with the auxiliary clock CLK_AUX such that the clock signal CLK_AUX is passed through and used for the second counter 10COUNT only during the predetermined fixed number of clock periods of the input clock signal FMEAS. The input signal DIR is based on the end of burst signal EOB shown in FIG. 1. The end of burst signal EOB defines, whether or not an input RF signal is received through the antenna LR. Dependent on the presence or absence of the external RF excitation, the second counter 10COUNT is operated as an UP or a DOWN counter. If the power on reset signal POR shown in FIG. 1 is low, the second counter is reset through signal CLR.

The adder stage ADD is coupled to the output of the second counter 10COUNT. The adder stage can be used to add a previous calibration value to a present calibration value if the self-calibration is carried out a second time later during operation. The outputs OC0 to OC9 can be coupled to the switches (i.e. MOS transistors, e.g. as shown in FIG. 1, there with a reduced number of output signals OC0 to OC5) of the control stage CNTL_FMEAS. The logic stage LOGIC1 can be implemented as shown in FIG. 3.

Figure 3:
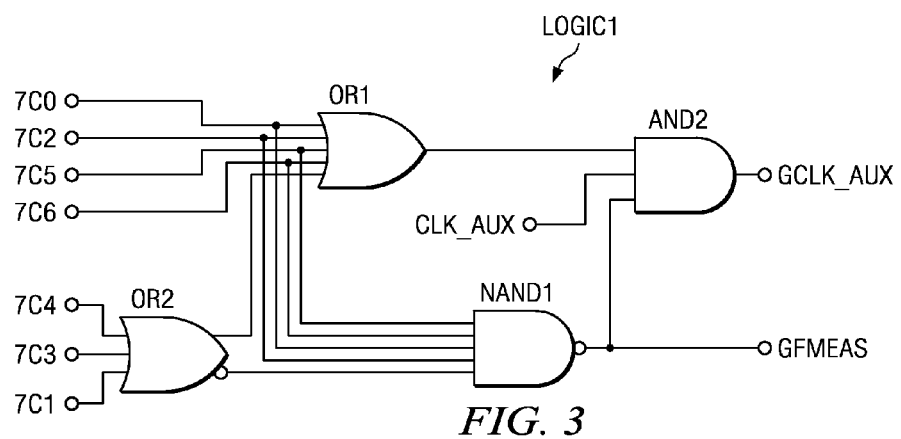
FIG. 3 is a simplified circuit diagram of a logic stage according to aspects of the present invention.

FIG. 3 shows a simplified circuit diagram of the logic stage LOGIC1 of FIG. 2 according to aspects of the present invention. The logic stage LOGIC1 receives seven output signals from the first counter 7COUNT (i.e. input signals 7C0 to 7C6) and provides trough logic gates OR1, OR2, NAND1 and AND2 a logic function, such that the auxiliary clock signal CLK_AUX received at the input CLK_AUX of gate AND2 is only passed through to the gated auxiliary clock signal GCLK_AUX during a fixed number of clock cycles of the first clock signal FMEAS. The periods of clock signal FMEAS are counted in the first counter 7COUNT. The output signal GFMEAS is the gating signal for the input clock FMEAS as shown in FIG. 2.

The signal ON (already shown in FIG. 1 and also in FIG. 2) input to the adder stage ADD is a new additional signal not known from conventional RFID transponders. The signal ON indicates a point of time for self-calibration with the control stage according to the present invention.

During a specific stage of the manufacturing process or during operation of the RFID transponder, the self-calibration procedure is performed as follows: During a charging phase, during which the transponder is charged via a RF signal, the second counter 10COUNT counts for a predetermined fixed number of periods of the digitized clock signal FMEAS (derived from the oscillation of the resonant circuit CR, LR) the periods of the auxiliary clock signal CLK_AUX derived from the ring oscillator's oscillation frequency. The ring oscillator is implemented in the auxiliary oscillation stage OSC_AUX of FIG. 2. The fixed number of periods is defined by the first counter 7COUNT. For example, the counter 7COUNT can be adapted to count 100 cycles of the clock signal FMEAS. The stop point of the counter 7COUNT (after 100 cycles) is defined by the logical gate stage LOGIC1. Gates OR2, NAND1 and AND2 are used for this purpose. The stop point is implemented by a door circuit for the clock FMEAS of the UP-counter 7COUNT, which is implemented through gate AND1 shown in FIG. 2. The door circuit for the auxiliary clock signal CLK_AUX is implemented through gates OR2, OR1 and AND2. The clock input of the second counter 10COUNT is only provided during the predetermined fixed number of clock cycles of the circuit clock FMEAS, e.g. 100 cycles in this example. The clock signal FMEAS is provided by the clock regenerator or the oscillation maintenance circuit in combination with the resonant circuit CR, LR. The ring oscillator frequency CLK_AUX can, for example, be 1 MHz and the system clock frequency CLK (FMEAS) can be 135 kHz. The UP/DOWN-counter 10COUNT then counts exact up to 741. This corresponds to a measured clock period of 7.41 µs. FMEAS is equal to the interrogator frequency in this step.

When the interrogator switches off, the oscillation of the RFID transponder resonant circuit CR, LR is maintained by the oscillation maintenance circuit. Now, the UP/DOWN-counter 10COUNT is counted downwards for the same number of periods defined by the UP-counter 7COUNT, wherein the second counter 10COUNT is again clocked by the auxiliary clock signal CLK_AUX. The ring oscillator should have a short time stability and must be supply voltage independent in order to have always the same frequency, during both, the charging phase and a later self-calibration phase. After having counted down, counter 10COUNT has either an overflow or a remaining value. This remaining value or overflow represents the period duration difference between interrogator and self-oscillation frequency of the resonant circuit CR, LR.

In the present example, we can assume that the self-resonant frequency of the resonant circuit CR, LR is 143 kHz. Therefore, the ring oscillator clock cycles, i.e. the periods of the clock signal CLK_AUX are counted for a shorter time compared with the charging phase, where the interrogator RF signal was present. The UP/DOWN-counter 10COUNT stops down counting at a positive value of exact 41 (this value is equal to a 0.41 µs period duration difference). Based on this value, a correction capacitance for the trimming array of the self-calibration circuit (capacitors CT0 to CT1 is shown in FIG. 1) can be determined, for example, through addition of this value to an existing trimming value. The result is a new trimming value for the known trimming array, which is applied to the RFID front end when the signal ON is activated. In order to implement this function, the trimming array can preferably be weighted for binary period duration steps. The circuits and concepts of the present invention can be used during final test alone or during any application for tuning correction of the RFID transponder. For fine tuning functions, a new trimming value may only be applied for the actual reading cycle of the transponder. In this case, the self-calibration must be repeated every time the transponder is activated. For the first self-calibration run during a final test in the manufacturing line or for high claims on the transponder stability (e.g. for an extended temperature range or with low tolerance external parts (antenna LR)), the trimming value can be burned into a permanent non-volatile memory, such as a trimming EEPROM memory. This however, requires an additional EEPROM programming cycle.

Figure 4:
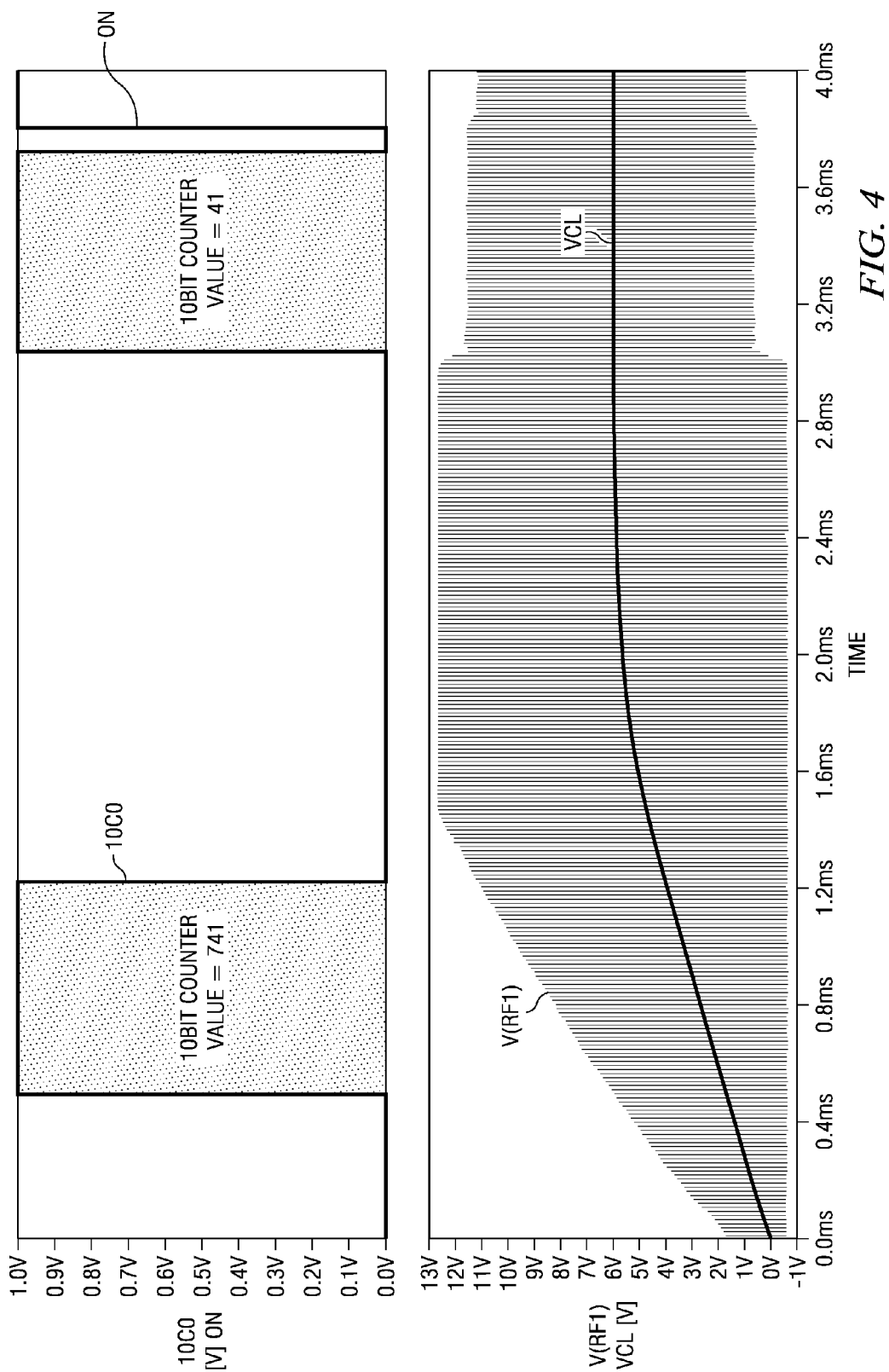
FIG. 4 shows waveforms relating to an RFID transponder according to the present invention.

FIG. 4 shows waveforms relating to an RFID transponder according to the present invention. In the lower part of FIG. 4, the known transponder function is shown. The oscillating signal is the signal on node RF1 shown in FIG. 1. The bold line in the middle of the oscillation is the internal power supply voltage VCL. The first portion (approx. between 0 and 1.5 ms) of the oscillating signal relates to the charging phase. After the power on reset signal POR is activated, the counter 10COUNT is operated to count 741 clock periods of the auxiliary clock signal CLK_AUX. In the upper part of FIG. 4, the lowest bit of the second counter 10COUNT (10C0) is shown. When the external charging burst ends, the end of burst signal EOB is activated and the second counter 10COUNT starts counting again. Since the resonant frequency of the internal resonant circuit CR, LR of the RFID transponder is too high, the counter activation time of counter 10COUNT is shorter than during the charging phase. In the present example, only 700 (which corresponds to 143 kHz) periods of the auxiliary frequency generated by the internal ring oscillator. During oscillation maintenance, the counter 10COUNT is operated as a down counter. Accordingly, the result is 41. This counter result (contained in output signals 10C0 to 10C9) are added to the actual trimming value contained in the adder stage ADD. The result is applied through output signals OC0 to OC9 to the trimming array (shown in FIG. 1 with a reduced number of capacitors CT1 to CT6) with a rising edge of the signal ON, which is also shown in the upper part of FIG. 4. The final oscillation frequency of the signal at node RF1 in FIG. 1 will then be 135.4 kHz.

FIG. 5 is a block diagram of a RFID identification system according to the present invention. A read-write unit 502 generates a stimulous signal at a first frequency for exciting a resonant circuit on the RFID transponder during an interrogation period. During an oscillation maintenance period the transponder generates a second clock frequency to excite the resonant circuit. The transponder is calibrated based on the comparison of the two clock frequencies as already described.

Although the present invention has been described with reference to a specific embodiment, it is not limited to this embodiment and no doubt alternatives will occur to the skilled person that lie within the scope of the invention as claimed.

The invention claimed is:

1. A RFID transponder comprising:
an LC resonant circuit for providing a clock signal at a predetermined clock frequency in a received mode and for transmitting the predetermined frequency in a transmit mode;
a self-calibration stage for calibrating the current clock frequency of the resonant circuit towards the predetermined clock frequency;
wherein the self-calibration stage is adapted to compare a first clock frequency of the resonant circuit determined during an interrogation period, during which the resonant circuit is excited by an external RF signal, with a second clock frequency determined by the LC resonant circuit during a oscillation maintenance period, during which the resonant circuit is excited internally through an oscillation maintenance circuit of the RFID transponder and the external RF signal is absent, and to calibrate the resonant circuit towards the predetermined clock frequency based on the comparison result;
and further comprising an auxiliary oscillator for providing an auxiliary clock signal, wherein the self-calibration stage comprises a first counter for counting clock periods of the clock signal and a second counter for counting clock periods of the auxiliary clock signal, wherein the calibration stage is further adapted to count the clock cycles of the auxiliary clock signal during a fixed number of clock cycles of the clock signal during the interrogation period and during the oscillation maintenance period and to compare the counts.

2. The RFID transponder according to claim 1, wherein the self-calibration stage further comprises a trimming means to be coupled to the resonant circuit for calibrating the clock frequency towards the predetermined clock frequency through the counter output.

3. The RFID transponder according to claim 2, wherein the trimming means comprises an array of capacitors and switches for selectively switching the capacitors in parallel to the a capacitor of the resonant circuit so as to adjust the resonant frequency of the resonant circuit for calibrating the clock frequency.

4. The RFID transponder according to claim 3, further comprising an adder for adding a previous calibration value to a current calibration value.

5. The RFID transponder according to claim 2, wherein the first counter is an UP/DOWN counter, and the self-calibration stage is adapted to switch the first counter from an up counting mode during the interrogation period to a down counting mode during the oscillation maintenance period.

6. The RFID transponder according to claim 2, further comprising an adder for adding a previous calibration value to a current calibration value.

7. The RFID transponder according to claim 1, wherein the first counter is an UP/DOWN counter, and the self-calibration stage is adapted to switch the first counter from an up counting mode during the interrogation period to a down counting mode during the oscillation maintenance period.

8. The RFID transponder according to claim 7, further comprising an adder for adding a previous calibration value to a current calibration value.

9. The RFID transponder according to claim 1, wherein the auxiliary oscillator is a ring oscillator.

10. The RFID transponder according to claim 1, wherein the auxiliary clock frequency is between 5 and 10 times greater than the target clock frequency.

11. The RFID transponder according to claim 1, further comprising an adder for adding a previous calibration value to a current calibration value.

12. A method for self-calibrating a RFID transponder having an LC resonant circuit used for receiving an externally generated RF signal and for generating a transmitted RF signal, the method comprising:
determining a first clock frequency derived from an oscillation of an LC resonant circuit of the RFID transponder during an interrogation period, during which the resonant circuit is externally excited by a RF signal;
determining a second clock frequency derived from an oscillation of the LC resonant circuit, during an oscillation maintenance period during which the resonant circuit is internally excited by an oscillation maintenance circuit and the external RF signal is absent;
determining a difference between the first clock frequency and the second clock frequency by counting the clock cycles of the auxiliary clock signal during a fixed number of clock cycles of the clock signal during the interrogation period and during the oscillation maintenance period and to compare the counts;
and calibrating the resonant circuit in accordance with the determined difference.

13. A method of manufacturing an RFID transponder comprising:
fabricating an RFID circuit having a self-calibration circuit thereon;
exciting an LC resonant circuit in said RFID circuit with an external signal at a first clock frequency;
determining the first clock frequency from an oscillation of the LC resonant circuit;
exciting the resonant circuit during oscillation maintenance period by an internal oscillation maintenance circuit during which the external RF signal is absent;
determining a second clock frequency derived from the oscillation of the LC resonant circuit during the oscillation maintenance period;
determining a difference between the first and second clock frequencies by counting the clock cycles of the auxiliary clock signal during a fixed number of clock cycles of the clock signal during the interrogation period and during the oscillation maintenance period and to compare the counts;
and calibrating the LC resonant circuit in accordance with the determined difference.

14. A system for calibrating an RFID transponder having an LC resonant circuit comprising:
a read-write unit external to an RFID transponder and generating
a signal to prompt an RFID transponder to perform a self-calibration procedure;
an RFID transponder comprising a self-calibration circuit responsive to a first clock frequency generated by the read-write unit during an interrogation period;

an oscillation maintenance circuit for providing a second clock frequency generated by the LC resonant circuit during an oscillation period and the external RF signal is absent;

wherein the RFID transponder is calibrated based on a comparison of the first and second clock frequencies; and further comprising an auxiliary oscillator for providing an auxiliary clock signal, wherein the self-calibration stage comprises a first counter for counting clock periods of the clock signal and a second counter for counting clock periods of the auxiliary clock signal, wherein the calibration stage is further adapted to count the clock cycles of the auxiliary clock signal during a fixed number of clock cycles of the clock signal during the interrogation period and during the oscillation maintenance period and to compare the counts.

* * * * *